United States Patent
Kang et al.

(10) Patent No.: US 6,462,534 B2
(45) Date of Patent: Oct. 8, 2002

(54) SEMICONDUCTOR PACKAGE TESTING EQUIPMENT INCLUDING LOADER HAVING PACKAGE GUIDER AND METHOD OF LOADING A SEMICONDUCTOR PACKAGE ONTO A TEST SOCKET AS ALIGNED THEREWITH

(75) Inventors: Seong-goo Kang; Byoung-jun Min; Hyo-geun Chae; Jeong-ho Bang, all of Ahsan (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/805,212

(22) Filed: Mar. 14, 2001

(65) Prior Publication Data

US 2001/0026152 A1 Oct. 4, 2001

(30) Foreign Application Priority Data

Mar. 30, 2000 (KR) .......................... 2000-16464

(51) Int. Cl.⁷ .............................................. G01R 31/02
(52) U.S. Cl. ................... 324/158.1; 324/755; 324/758; 324/765
(58) Field of Search .............................. 324/73.1, 158.1, 324/765, 758, 755, 756, 754; 901/40; 414/416.11, 78 B, 784, 422

(56) References Cited

U.S. PATENT DOCUMENTS 5,523,678 A * 6/1996 Mitsui ...................... 324/158.1

* cited by examiner

*Primary Examiner*—Michael Sherry
*Assistant Examiner*—Tung X. Nguyen
(74) *Attorney, Agent, or Firm*—Volentine Francos, PLLC

(57) ABSTRACT

A loader of semiconductor package burn-in test equipment allows a test socket to be commonly used for semiconductor packages of all sizes. The loader includes a vacuum suction head for picking semiconductor packages to be tested, and a package guider for ensuring that semiconductor packages of any size will be aligned with the test socket. As the semiconductor package is positioned over the test socket by the vacuum suction head of the loader, guide surfaces of the package guider are brought inwardly into guide positions at which the surfaces extend just beneath the vacuum suction head. Any semiconductor package that is not in alignment with the test socket while being held by the vacuum suction head is guided by the guides surfaces into alignment once the vacuum suction is turned off and the package falls from the vacuum suction head. Thus, the package guider serves as an adaptor, eliminating the need for several test sockets having respective adaptors for different sizes of semiconductor packages.

16 Claims, 12 Drawing Sheets

SEMICONDUCTOR PACKAGE TESTING EQUIPMENT INCLUDING LOADER HAVING PACKAGE GUIDER AND METHOD OF LOADING A SEMICONDUCTOR PACKAGE ONTO A TEST SOCKET AS ALIGNED THEREWITH

BACKGROUND OF THE INVENTION

1. Field of the Invention

The present invention relates to the testing of semiconductor devices. More particularly, the present invention relates to a loader which is used in a burn-in test.

2. Description of the Related Art

A burn-in test is a reliability test which is performed before electronic components, such as memories or logic devices, are graded acceptable. In particular, the burn-in test applies severe stress in the form of a high temperature, a voltage, a pulse (clock) or the like, to semiconductor devices to in effect speed up a point in time at which a defective semiconductor device fails. Thus, the defective semiconductor devices are detected early on, and only the good semiconductor devices are subjected to a final electrical test and are then sent out.

The burn-in test includes the steps of: a) loading a semiconductor package onto a burn-in board having a test socket, b) testing the semiconductor package loaded on the burn-in board for a certain period of time while a stress produced by a burn-in system is applied to the semiconductor package, and c) unloading a burn-in tested semiconductor package from the burn-in board. In this test, a loader is used to load the semiconductor package onto and unload the semiconductor package from the test socket of the burn-in board.

Figure 1:
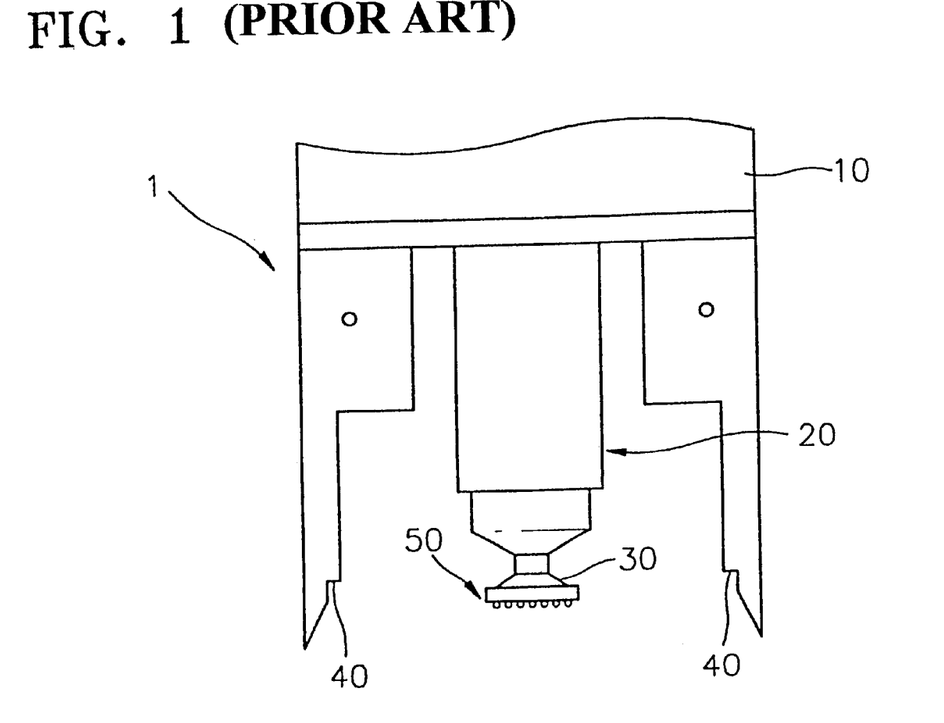
FIG. 1 is a schematic side view of a conventional loader for use in semiconductor package testing.

FIG. 1 is a schematic front view of a general loader of semiconductor package testing device. Referring to FIG. 1, the loader 1 generally includes a main loader body 10, a main nozzle body 20 capable of vertical movement, a vacuum suction head 30, and a socket cover depressing head 40. The vacuum suction head 30 is connected to the bottom of the main nozzle body 20, and picks up a semiconductor package 50 using suction. The socket cover depressing head 40 extends around the main nozzle body 20 and the vacuum suction head 30, and depresses the socket cover of a test socket.

When the semiconductor package 50 is to be lifted and unloaded from the test socket, the main nozzle body 20 descends and picks up the semiconductor package 50 using the vacuum suction head 30. On the other hand, when the semiconductor is to be loaded onto the test socket, the suction from the vacuum suction head 30 is turned off while the main nozzle body 20 remains still, thereby dropping the semiconductor package 50 onto the test socket 50.

Figure 2:
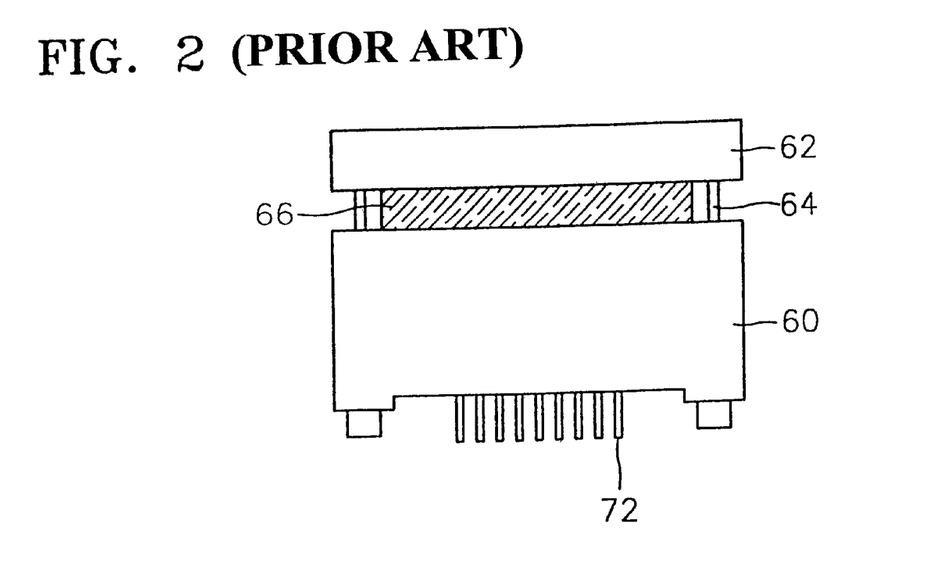
FIG. 2 is a schematic side view of a conventional test socket which is used with the loader of FIG. 1.

FIG. 2 is a schematic front view of the test socket which is used with the loader shown in FIG. 1. Referring to FIG. 2, the test socket includes a main body 60, a socket cover 62, a support bar 64, an adapter 66 and wiring 72. The support bar 64 acts as a spring which contracts/retracts when the socket cover 62 is depressed. Once the socket cover 62 is depressed, the adapter 66 guides a semiconductor package, that is dropped by the loader 1, to a position where an electrical connection between the package and the wiring 72 is established.

Figure 3:
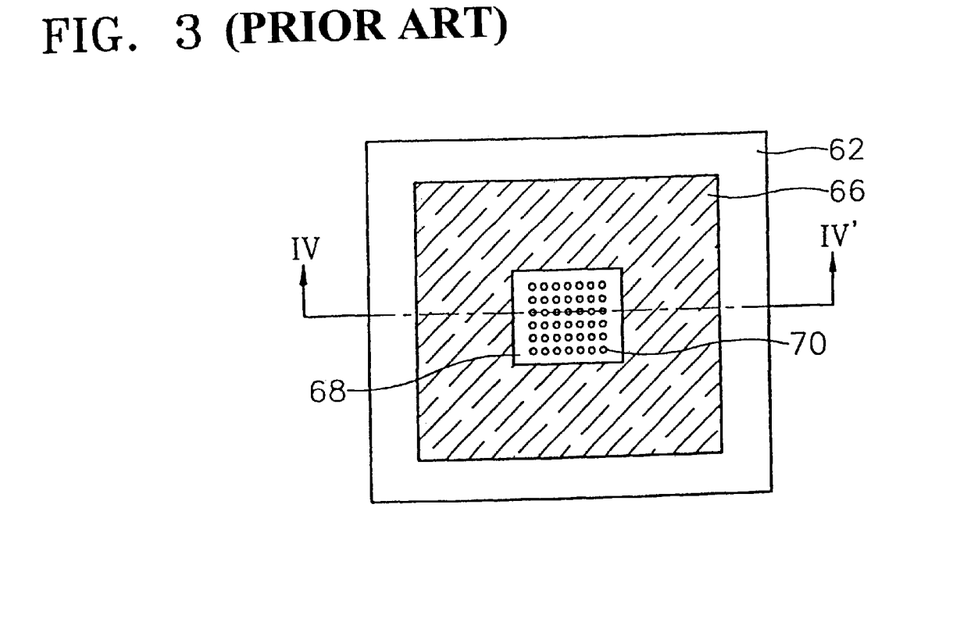
FIG. 3 is a plan view of the conventional test socket of FIG. 2.
Figure 4:
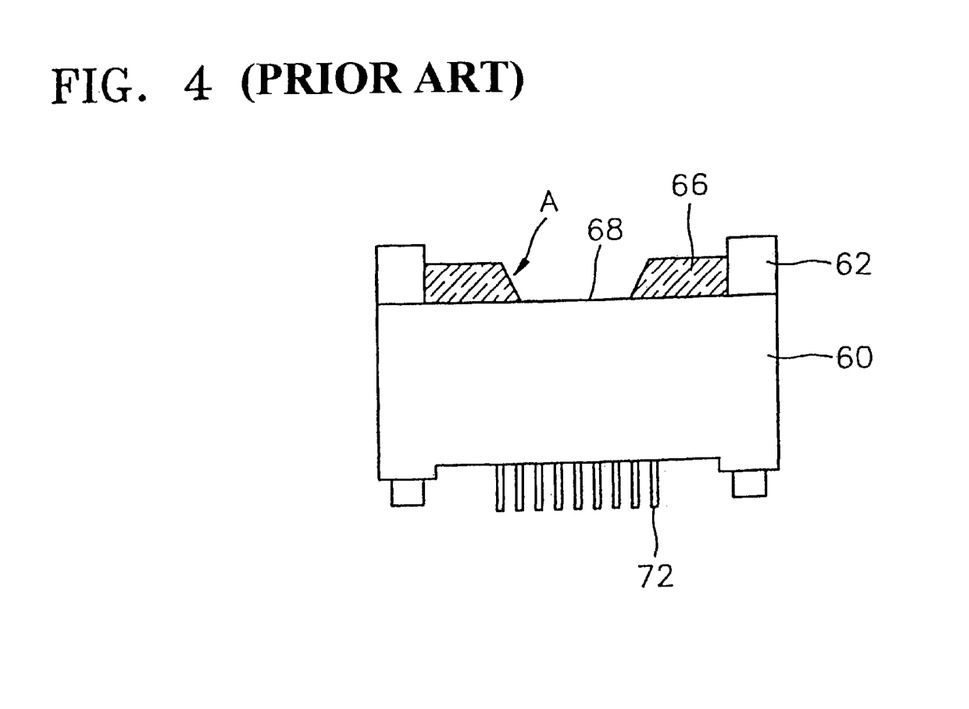
FIG. 4 is a sectional view of the conventional test socket taken along line IV–IV' of FIG. 3.

FIG. 3 is a plan view of the test socket and FIG. 4 shows the test socket with the socket cover 62 depressed. Referring to FIGS. 3 and 4, the wiring 72 extends to a flat connection plate 68 in which connection contacts 70 are located. The adapter 66 is disposed inside the socket cover 62, and the flat connection plate 68 is, in turn, located within the adapter 66. Thus, when a semiconductor package is loaded onto the flat connection plate 68, external connection terminals of the semiconductor package, for example, solder balls, are connected to the connection contacts 70 within the flat connection plate 68. The semiconductor package is subjected to the burn-in test in this state.

The size of the adaptor 66 varies according to the size of the semiconductor package which is to undergo the burn-in test. On the other hand, the flat connection plate 68 can accommodate semiconductor packages of all sizes. However, without the adaptor 66 present, the solder balls of the semiconductor package might not be aligned with, i.e., electrically connected to, the connection contacts 70 when dropped onto the test socket by the loader 1.

Referring now to FIG. 4, in particular, even if a semiconductor package is dropped from a loader while the solder balls of the package are not disposed directly over the corresponding connection contacts 70, the inclined walls A of the adaptor 66 align the semiconductor package with the connection contacts. That is, the solder balls of the semiconductor package are correctly seated on the connection flat plate 68 and are thus electrically connected to the connection contacts 70.

Figure 5:
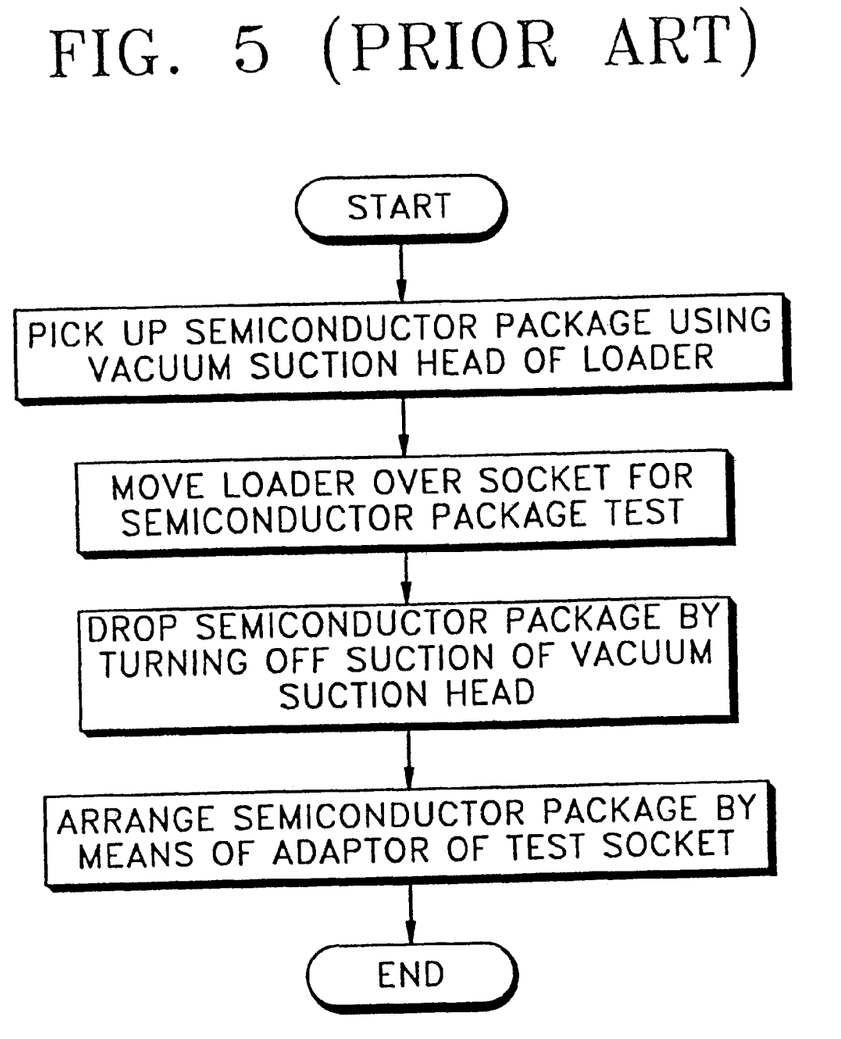
FIG. 5 is a flowchart illustrating a method of using the conventional loader for semiconductor package testing.

FIG. 5 is a flowchart illustrating a method of using a conventional loader for semiconductor package testing. Referring to FIG. 5, the main nozzle body 20 of the loader 1 is lowered whereupon the vacuum suction head 30 of the loader 1 picks up a semiconductor package from the top using suction. Then, the loader 1 is moved over a test socket. Thereafter, the socket cover depressing head 40 of the loader 1 depresses the socket cover 62 of the test socket. Then, the suction of the vacuum suction head 30 of the loader 1 is turned off, whereby the semiconductor package is dropped onto the test socket. The falling semiconductor package is aligned by the adaptor 66 of the test socket, so that solder balls of the semiconductor package, which constitute external connection terminals of the semiconductor package, are connected to the connection contacts 70 of the test socket. In this state, the semiconductor package is tested under the internal electrical control of the loader equipment.

The use of the above-described loader for semiconductor package testing has the following problems. The test socket can be used only for semiconductor packages of the same size because of the adaptor. For example, a 1.2 cm×1.2 cm semiconductor package can not be tested using a burn-in test socket having an adaptor configured for a 1 cm×1 cm semiconductor package.

Therefore, a large number of burn-in boards are required for burn-in testing. The fabrication and management of this large number of burn-in boards is costly, and requires a lot of manpower and production storage space.

SUMMARY OF THE INVENTION

Accordingly, one object of the present invention is to provide a loader, for use in semiconductor package testing equipment, having a package guider which allows one test socket to be used for testing semiconductor packages of different sizes.

To achieve the first object, the present invention provides a loader including a main loader body, a main nozzle main body having a vacuum line therein and capable of moving vertically below the main loader body, a vacuum suction head integrated with the bottom of the main nozzle body, a socket cover depressing head extending around the main nozzle body and the vacuum suction head, below the main loader body, for depressing the socket cover of a test socket, and a package guider for guiding a semiconductor package as it falls from the vacuum suction head.

The test socket will be similar to that of a conventional burn-in test socket but in this case has no adaptor. The semiconductor packages to which the present invention is particularly well-suited are ball grid array (BGA) packages and chip scale packages (CSP).

The package guider comprises an upper package guide member, a plurality of (preferably four) lower package guide members, connection springs connecting the lower guide members to the upper guide member, and a mechanism, such as a camming mechanism, for moving guide surfaces of the lower guide members toward and away from each other. Preferably, the lower package guide members are pushed outward by the operation of the camming mechanism when the main nozzle body descends, and are pursed together by the connection springs to form a space through which the semiconductor package must pass when the main nozzle body is raised to a loading position. The camming mechanism can be constituted by protrusions on the lower guide members which coact with the main nozzle body as it is raised and lowered, under a biasing force exerted thereon by the connection springs.

Also, the lower package guide members are preferably formed of a conductive material, such as steel, to prevent static charges from accumulating on the semiconductor package as the package slides along and is guided by the lower guide members.

Another object of the present invention is to provide a method of loading a semiconductor package onto a universal test socket, wherein the semiconductor package is aligned with the test socket regardless of the size of the package.

To achieve this object, the present invention provides a method in which, first, a semiconductor package is picked up using a vacuum suction head. The semiconductor package is then moved over a universal test socket, i.e. a test socket that has no adaptor. The semiconductor package is dropped onto the test socket by turning off the vacuum suction of the vacuum suction head of the loader. However, as the semiconductor package is being placed over the test socket, guide surfaces are moved inwardly toward one another into guiding positions at which the guide surfaces are located between the semiconductor package and the test socket. In this state, the guide surfaces delimit a space through which the semiconductor package must pass when dropped onto the test socket. Thus, any semiconductor package that is gripped by the vacuum suction head but is portioned thereby out of alignment with the test socket, will be guided by the guide surfaces into alignment with the test socket when the suction is cut off and the mis-aligned semiconductor package is dropped onto the test socket.

Also, when the package is positioned over the test socket, the distance between the bottom of the guide surfaces and the surface of the test socket onto which the package is to rest is set to be smaller than the thickness of the semiconductor package. In this way, the guide surfaces guide the package from the time the package is released from the vacuum suction head to the time the package comes to rest on the test socket.

According to the present invention, as summarized above, the same test socket can be used for semiconductor packages of all sizes. Therefore, the manufacturing and equipment management costs associated with the testing of the semiconductor packages can be reduced.

BRIEF DESCRIPTION OF THE DRAWINGS

The above and other objects, features and advantages of the present invention will become more apparent from the following detailed description of a preferred embodiment thereof made with reference to the attached drawings, of which.

DETAILED DESCRIPTION OF THE PREFERRED EMBODIMENT

The preferred embodiment of the present invention will now be described in detail with reference to the FIGS. 6–17.

Figure 6:
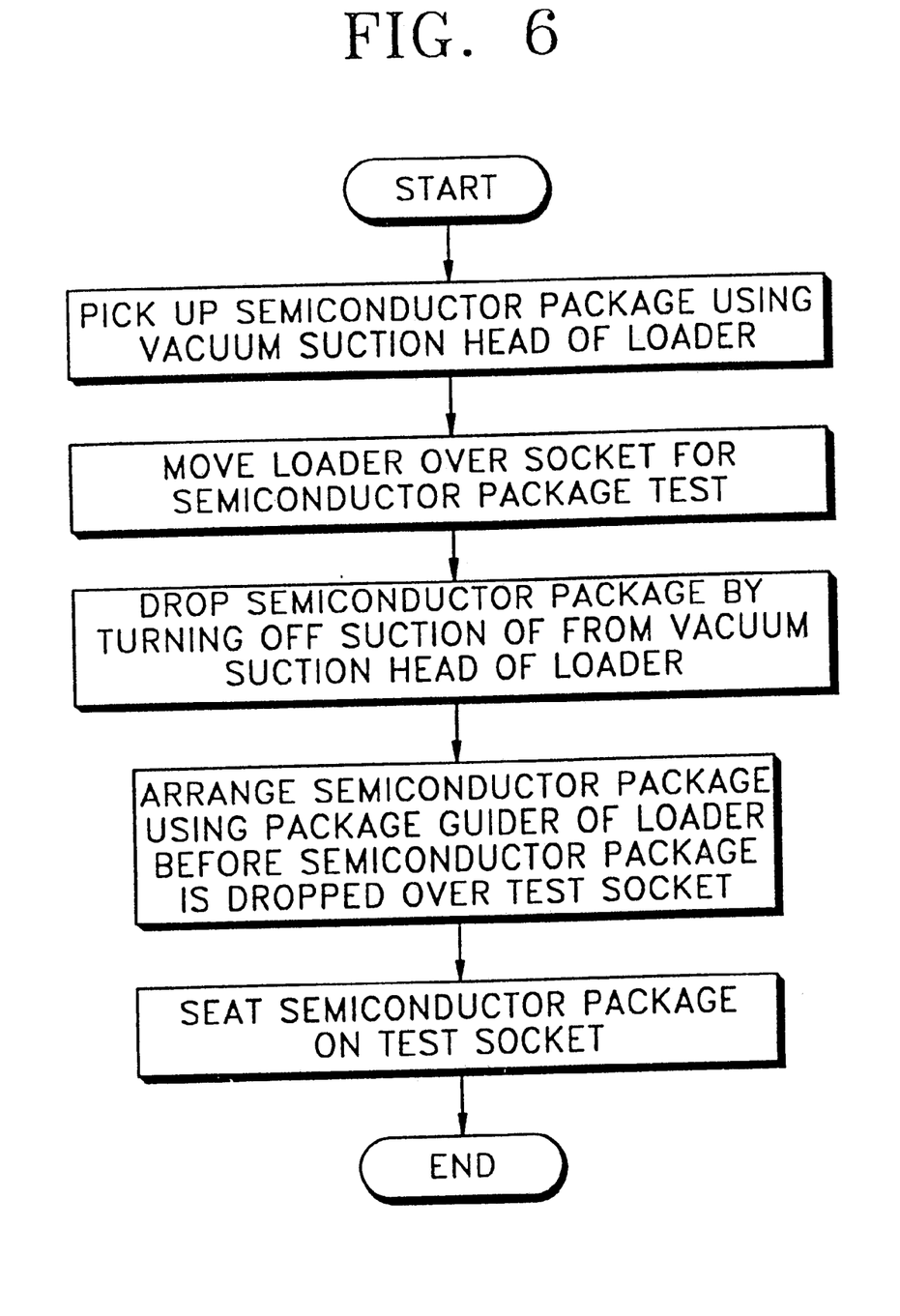
FIG. 6 is a flowchart illustrating a method of using a loader according to the present invention in semiconductor package testing.

Referring first to FIG. 6, first, a semiconductor package, for example, a ball grid array (BGA) package or a chip scale package (CSP), is picked up from its upper surface by a vacuum suction head of a loader. Then, the loader is moved over a test socket in response to an internal electrical signal of the loader equipment. Thereafter, the semiconductor package is dropped by turning off the suction of the vacuum suction head. As it drops from the vacuum suction head, the semiconductor package is guided by a package guider of the loader prior to being seated on the test socket. That is, the semiconductor package is placed on the test socket, in a state where it has already been positioned relative to the connection contacts of the socket.

Accordingly, the test socket does not require an adaptor for seating a semiconductor package on the flat connection plate of the test socket. Thus, the test socket can be a universal-type of test socket that can be used for semiconductor packages of all sizes.

Figure 7:
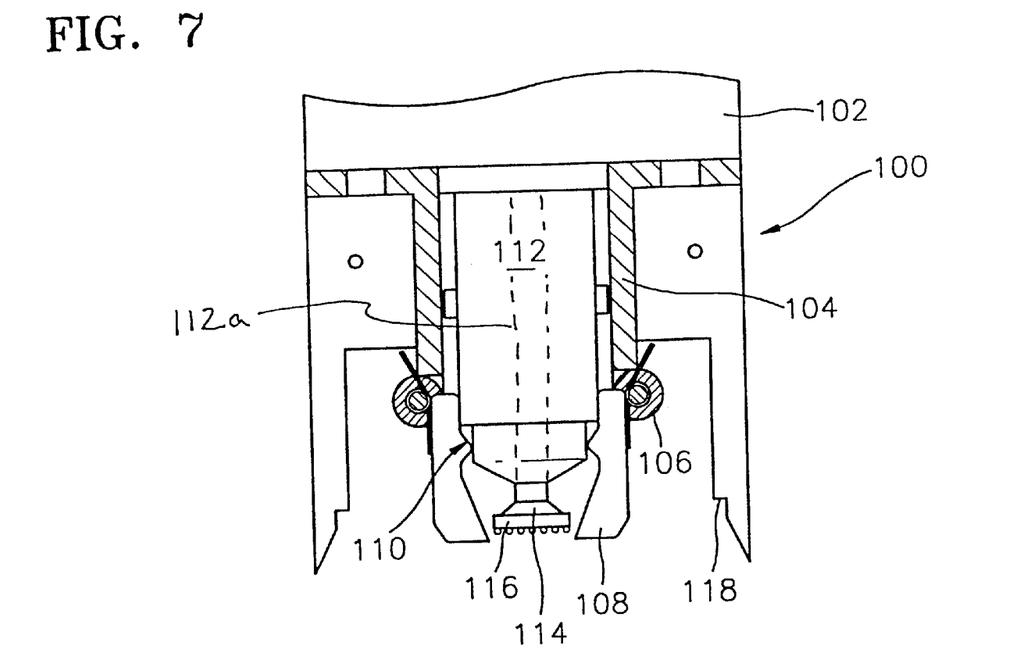
FIG. 7 is a schematic side view of a loader according to the present invention for use in semiconductor package testing.

FIG. 7 shows a loader for use in semiconductor package testing according to the present invention. Referring to FIG.

7, the loader 100 includes a main loader body 102, a main nozzle body 112 which includes a vacuum line 112a and is mounted to said main loader body 102 so as to be movable vertically relative to the main body, a vacuum suction head 114 disposed under the main nozzle body 112 for picking up a semiconductor package 116 using vacuum suction, and a socket cover depressing head 118 extending along the outer wall of the main nozzle body 112 for depressing a socket cover of a test socket. The socket cover depressing head defines a shoulder at a terminal end thereof configured to receive a complementary outer edge of the socket cover for depressing the same. In addition, the loader 100 includes a package guider interposed between the socket cover depressing head 118 and the nozzle main body 112, and disposed below the main loader body 102, for guiding a semiconductor package 116 as the semiconductor package 116 falls from the vacuum suction head 114 onto the test socket.

Figure 8:
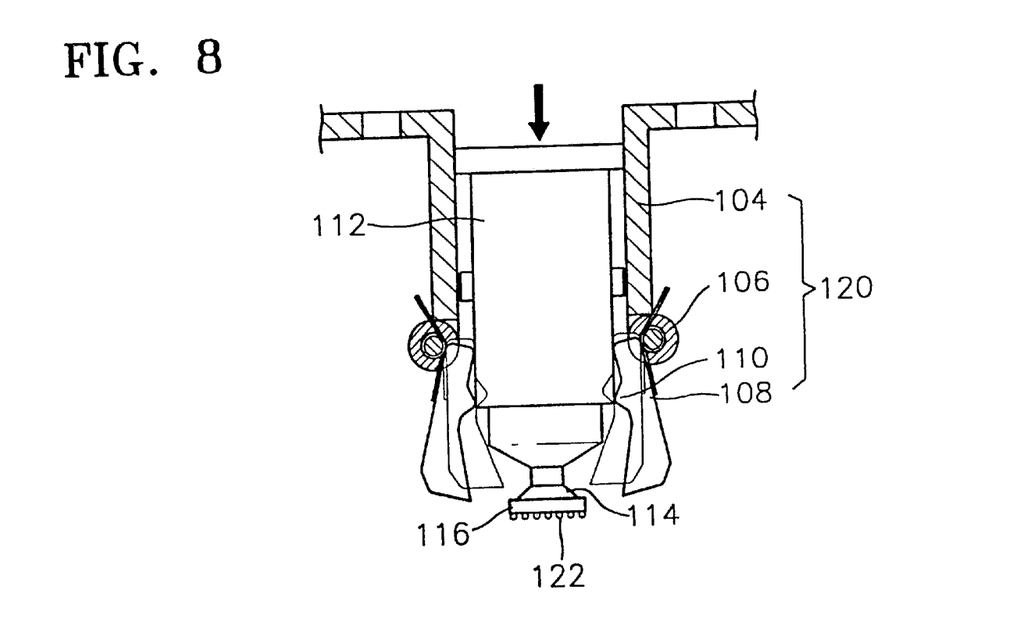
FIG. 8 is a schematic side view of package guiders of the loader according to the present invention.

Referring now to FIG. 8, the package guider 120 comprises an upper package guide member 104, lower package guide members 108, and connection springs 106. The upper package guide member 104 connects the lower package guide members 108 to the loader main body 102. The connection springs 106 connect the upper package guide member 104 to the lower package guide members 108, and also bias the upper portions of the lower package guide members 108 inward toward each other. The lower package guide members 108 guide the semiconductor package 116, which is falling from the vacuum suction head 114, by virtue of their inner guide surfaces. These inner guide surfaces are inclined relative to the vertical when the guide members 108 are in guide positions (described in more detail later on).

Furthermore, the guide members 108 have protrusions 110. When the nozzle main body 112 is located at an upper position, the lower package guide members 108 are closed, i.e., pursed as indicated by the faint lines in FIG. 8. In this state, the lower guide members 108 guide the semiconductor package 116, if necessary, as soon as it is dropped by the vacuum suction head 114. On the other hand, as the main nozzle body 112 descends, the protrusions 110 serve as a camming mechanism by coacting with the main nozzle body 112 to open the lower package guide members 108 as indicated by the darker lines of FIG. 8. Once the lower guide members 108 are opened wide, a semiconductor package 116 can be picked up by the vacuum suction head 114 without being obstructed.

Figure 9:
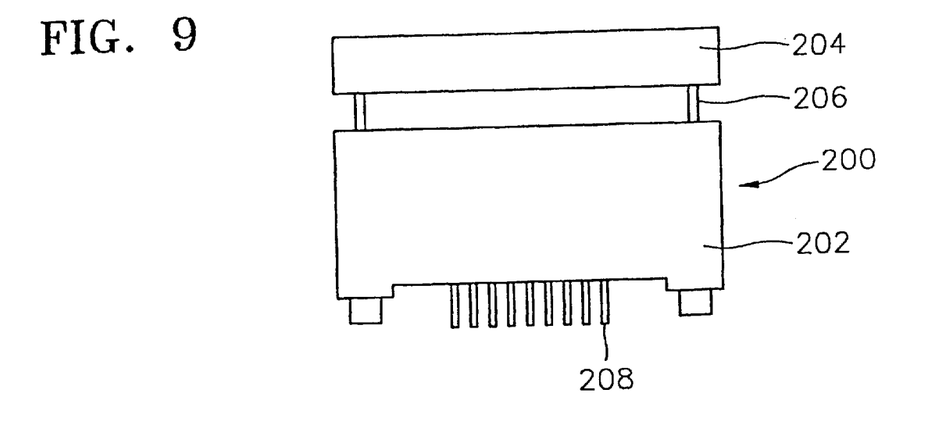
FIG. 9 is a side view of a test socket which is used with the loader according to the present invention for semiconductor package testing.
Figure 10:
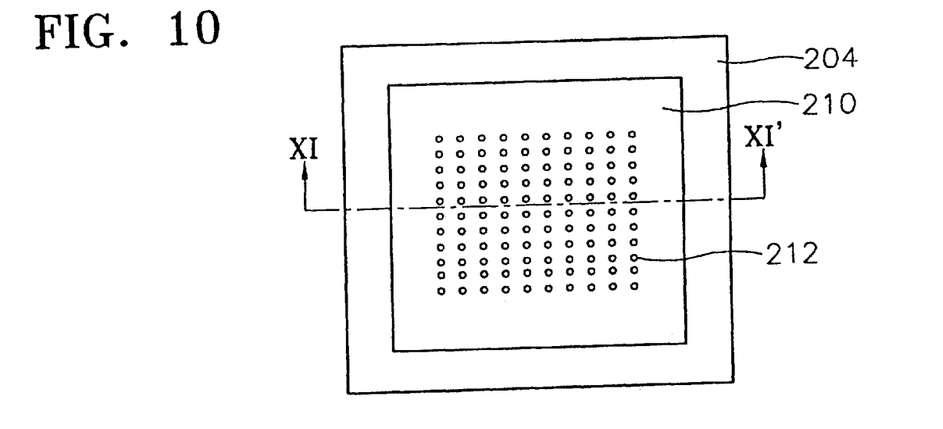
FIG. 10 is a plan view of the test socket of FIG. 9.
Figure 11:
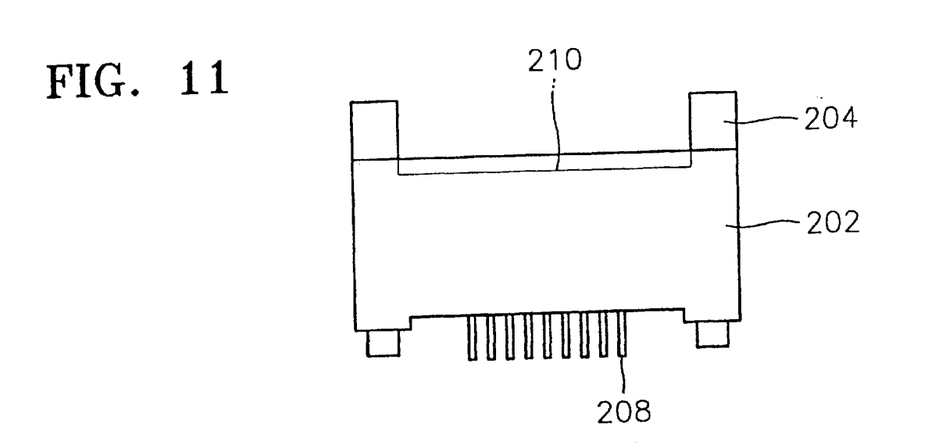
FIG. 11 is a sectional view of the test socket taken along line XI–XI' of FIG. 10.

FIGS. 9–11 show a test socket that is used with the loader of the present invention. The test socket 200 includes a socket cover 204, a main socket body 202, support bars 206 which are retracted into the main socket body 202 like springs when the socket cover 204 is depressed, a flat connection plate 210 (see FIG. 10) disposed in the main socket body 202 and having connection contacts 212, and wirings 208 which are connected to the connection contacts 212 of the flat connection plate 210. The connection contacts are configured so as to be alignable with external connection terminals, such as solder balls, of a semiconductor package.

The test socket 200 differs from the prior art test socket of FIGS. 2–4 in that it has no adaptor. The test socket 200 requires no adaptor because the loader guides the semiconductor package to a proper position on the test socket 200. Also, the test socket has a greater number of connection contacts 212 than the prior art test socket. This is so that any size semiconductor package, i.e., various semiconductor packages having different numbers of external electrical connections, such as solder balls, can be connected to the test socket. According to the present invention, the semiconductor package need only be properly aligned with the test socket. Thus, this test socket is a universal type of test socket.

A method of loading a semiconductor package onto the test socket according to the present invention will now be described with reference to FIGS. 12 through 17.

Figure 12:
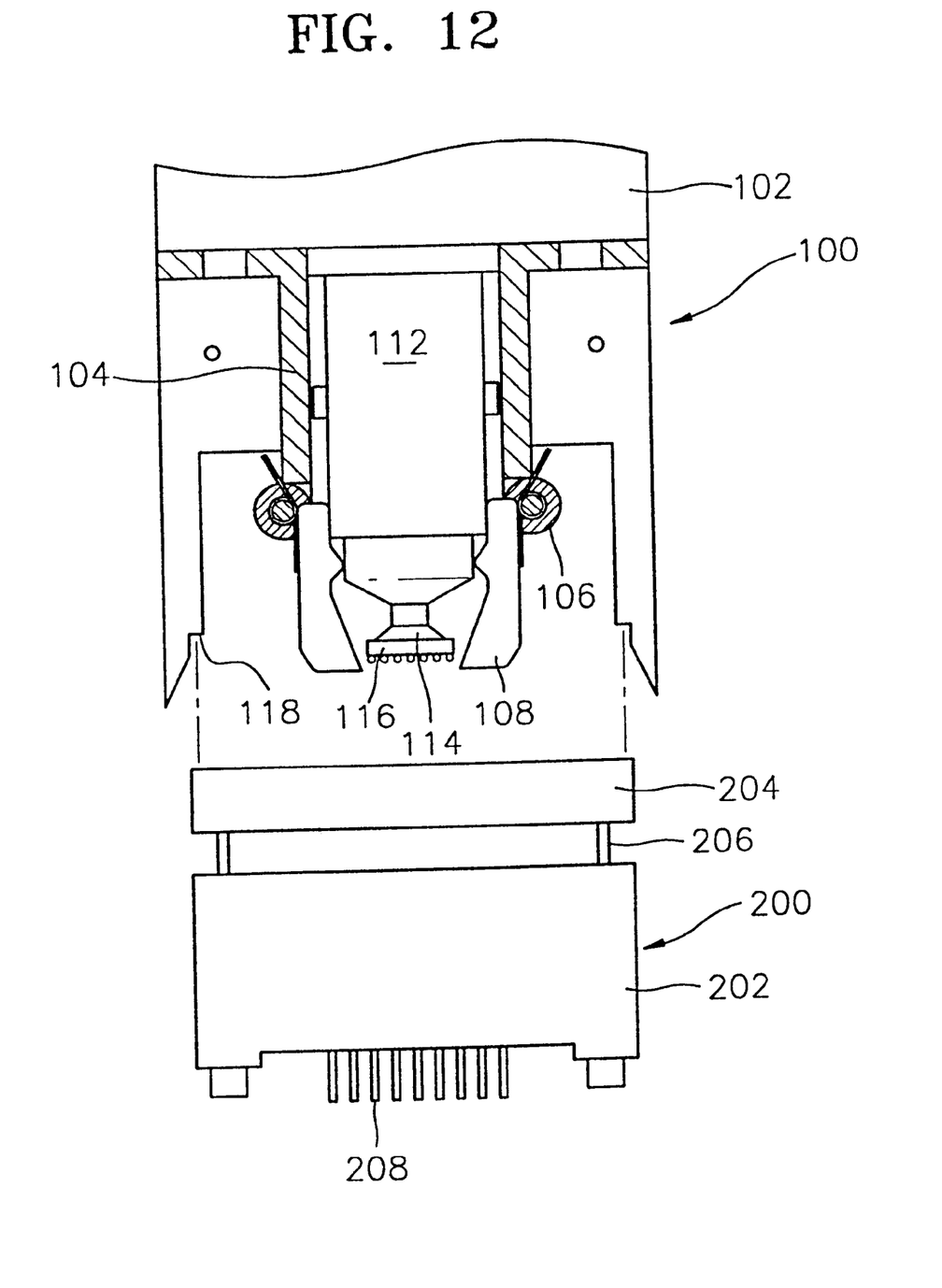
FIGS. 12 through 14 are side views of the test equipment in operation showing how the loader according to the present invention picks up a semiconductor package from a test socket.
Figure 13:
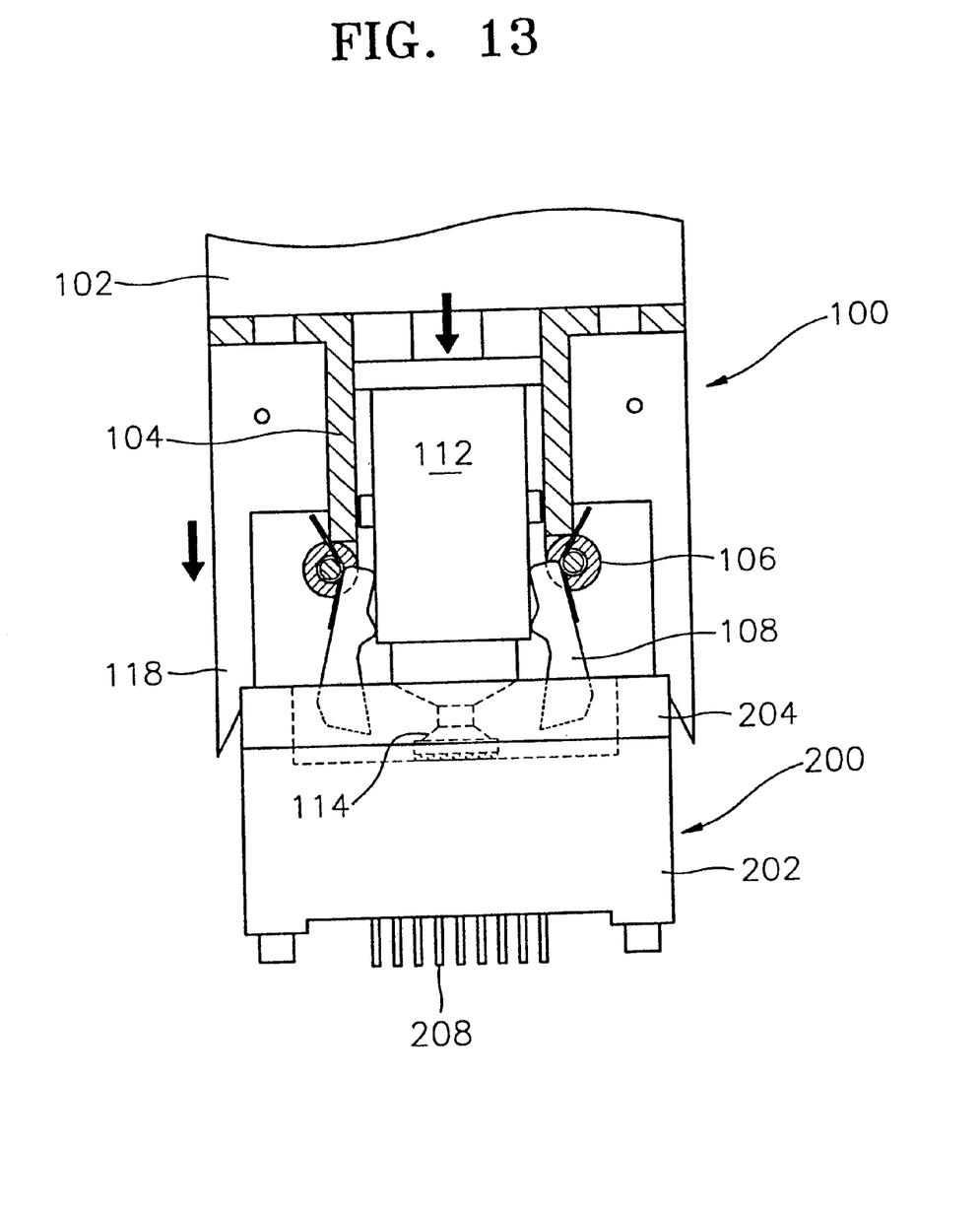
Figure 14:
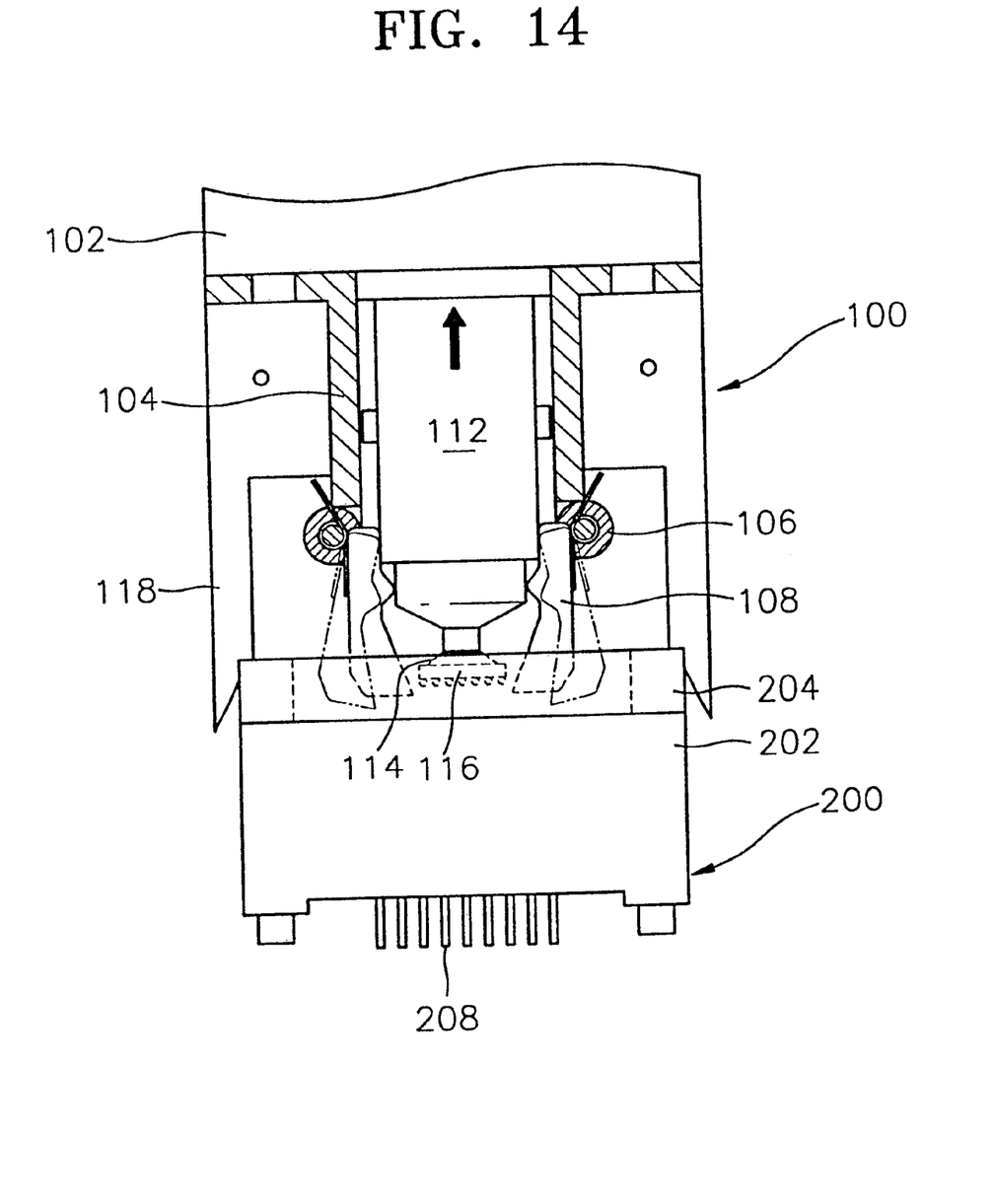

FIGS. 12 through 14 illustrate a pickup operation in which a loader picks up a semiconductor package from a test socket. Referring first to FIG. 12, the loader 100 is positioned over the test socket 200. As the main nozzle body 112 is descending, the lower package guide members 108 do not contact the flat connection flat plate of the test socket 200. This prevents the connection contacts of the connection plate from being damaged.

Next, as shown in FIG. 13, the socket cover depressing head 118 of the loader 100 presses down on the socket cover 204 of the test socket 200, whereby the support bars 206 of the test socket 200 are depressed and are retracted into the main socket body 202. At this time, the main nozzle body 112 of the loader 100 is lowered. The descending main nozzle body 112 pushes the lower package guide members 108, via the protrusions 110 integral therewith, outward. In this state, the semiconductor package is gripped by the vacuum suction head 114 using vacuum suction.

Finally, as shown in FIG. 14, with the lower package guide members 108 opened wide, the main nozzle body 112 is raised, whereby the semiconductor package 116 is picked up from the test socket 200. The lower package guide members 108 remain open so as not to obstruct the semiconductor package 116 while it is being lifted from the test socket 200. Then, the main nozzle body 112 returns to its original upper position, and the lower package guide members 108 are biased into a closed position in which the lower inclined surfaces thereof are closest to each other.

Figure 15:
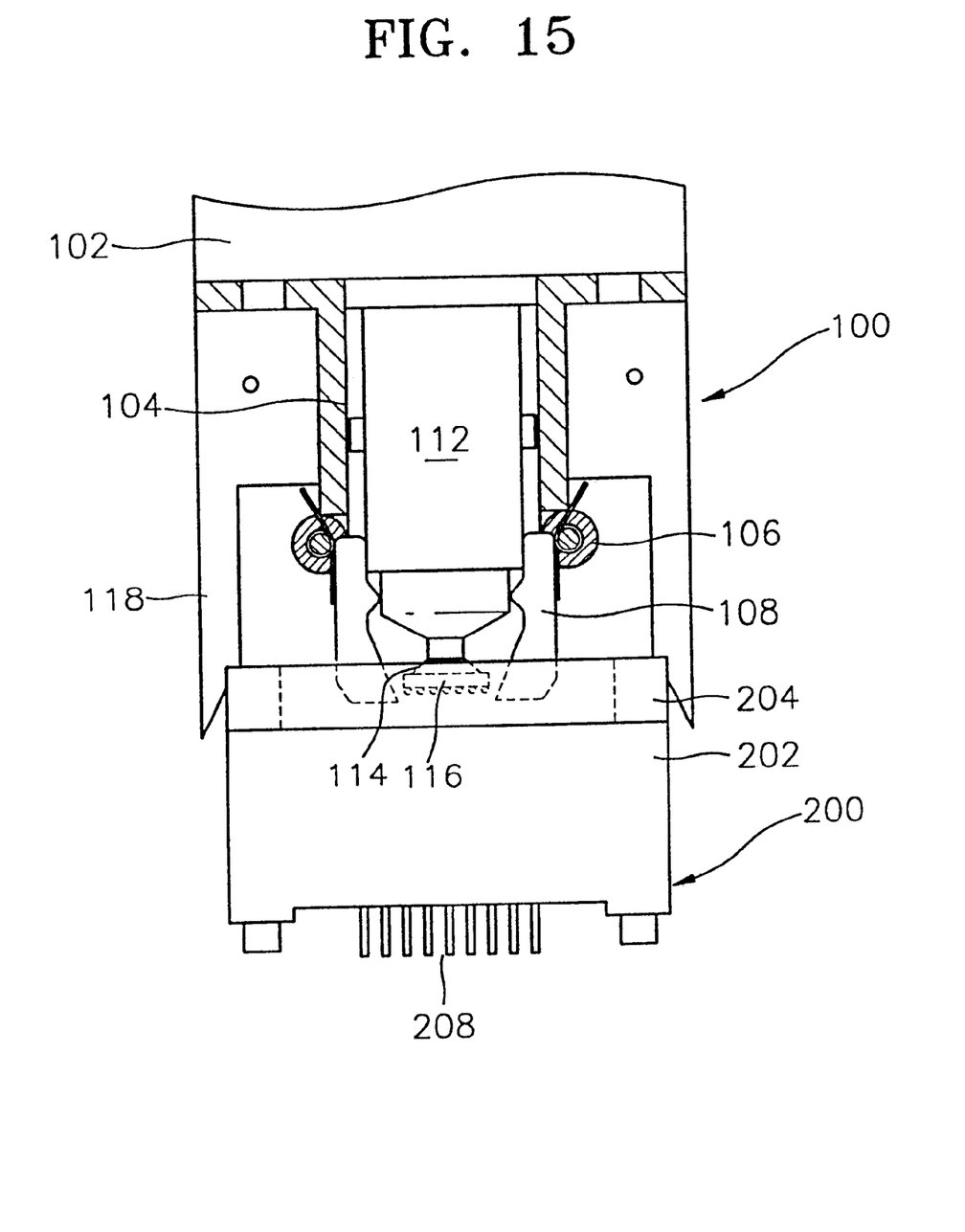
FIGS. 15 through 17 are side views of the test equipment in operation showing how the loader according to the present invention loads a semiconductor package onto a test socket.
Figure 16:
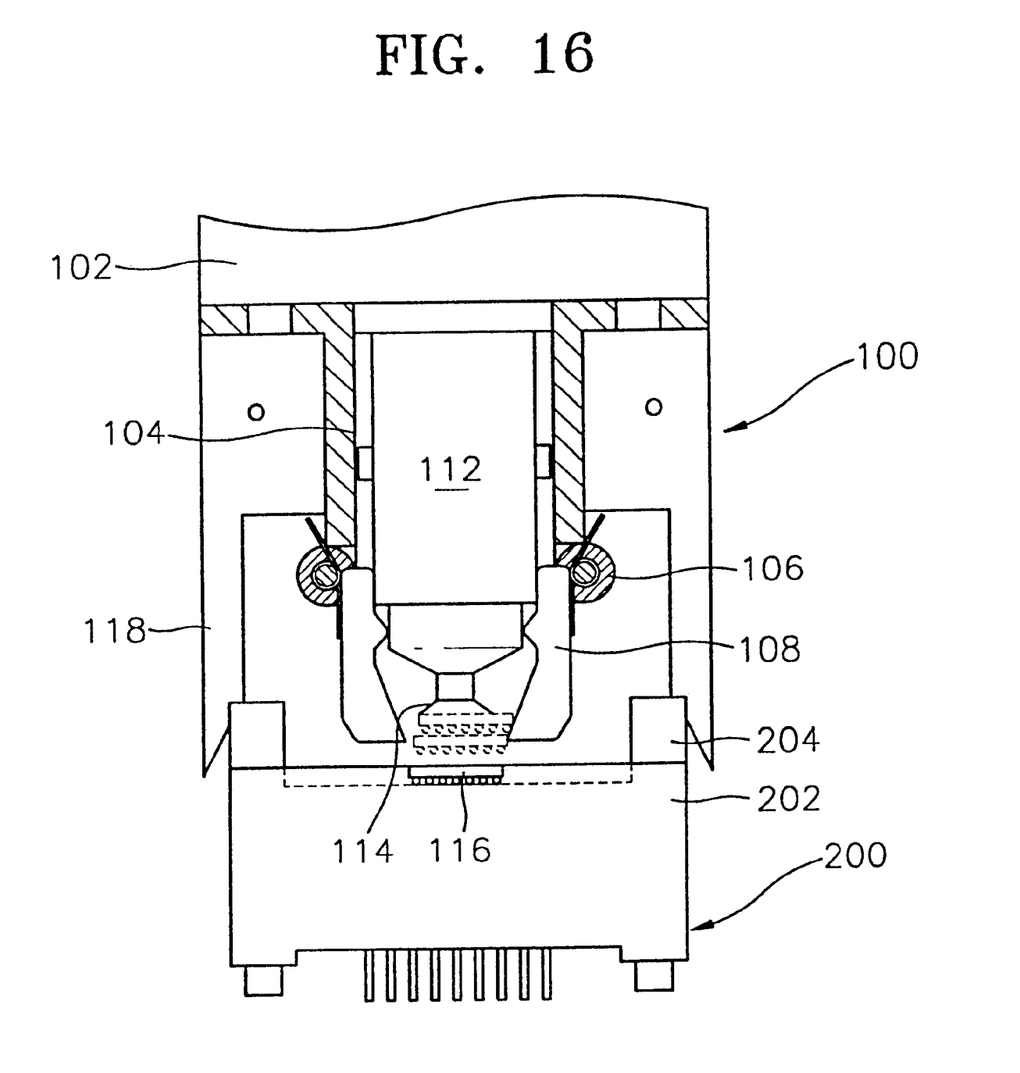

FIGS. 15 and 16 illustrate an operation in which the loader loads a semiconductor package onto the test socket 200. Referring first to FIG. 15, the loader 100 which has picked up the semiconductor package 116 is moved over the test socket 200, onto which the semiconductor package 116 is to be loaded, in response to an electrical signal issued by the loader equipment. Thereafter, the suction of the vacuum suction head 114 of the loader 100 is turned off so that the semiconductor package 116 is dropped towards the test socket Referring to FIG. 16, even if the vacuum suction head 114 of the loader has grasped the edge of the semiconductor package 116 rather than the center thereof, the semiconductor package 116 is aligned accurately with the test socket by the inclined inner surfaces of the lower package guide members 108. Preferably, the interval between the bottom surfaces of the lower package guide members 108 and the flat connection plate of the test socket 200 is smaller than the thickness of the semiconductor package so as to prevent the semiconductor package 116, aligned with the test socket by the lower package guide members 108, from coming out of alignment before it comes to rest on the flat connection plate.

Figure 17:
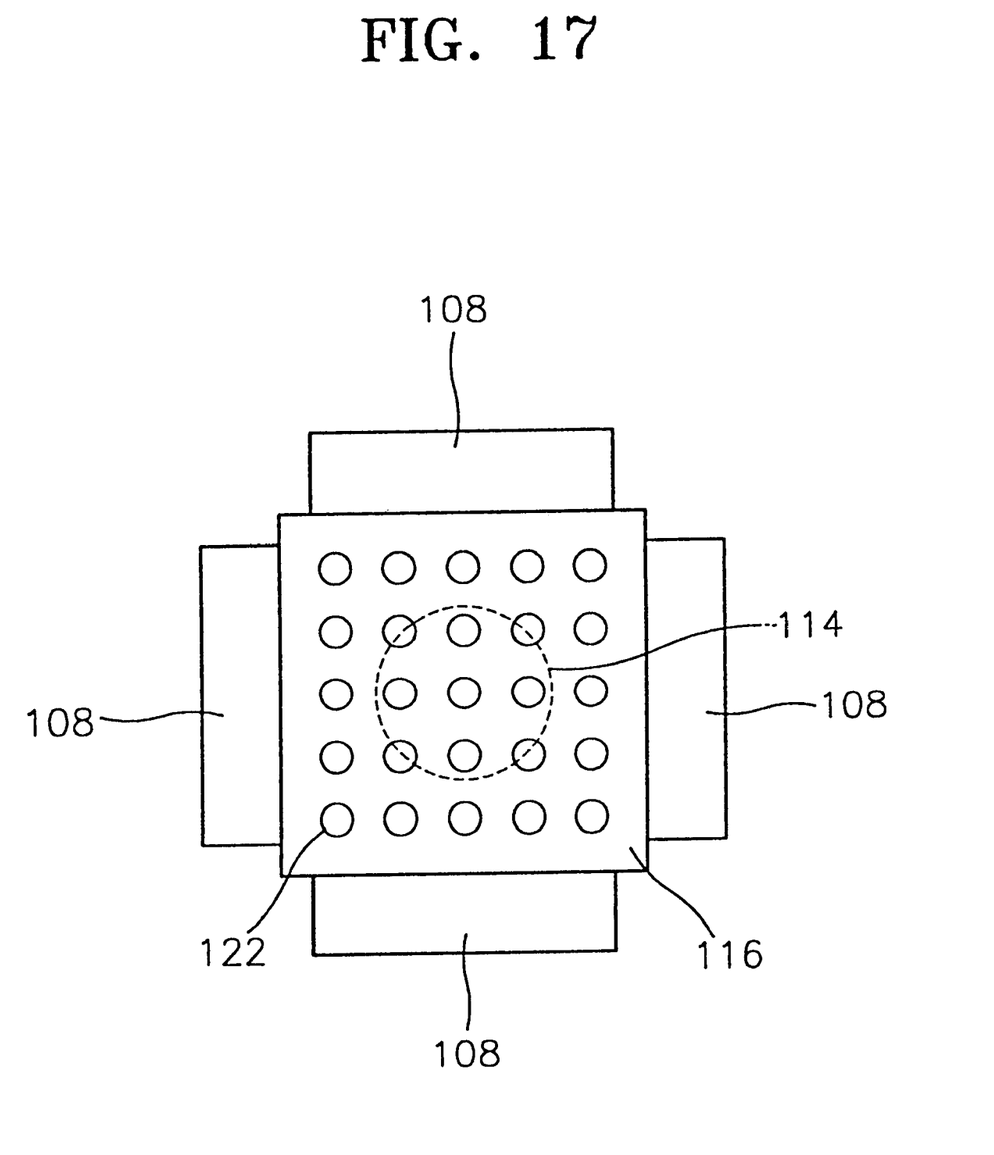

FIG. 17 is a bottom view of the semiconductor package 116 as it is being dropped from the loader. In FIG. 17, reference numeral 122 denotes a solder ball that serves as an external connection terminal of the semiconductor package 116, and reference numeral 114 denotes the ideal location at which the vacuum suction head of the loader should grip the semiconductor package 116. As can be seen from the figure, the loader has four lower package guide members 108 to accurately align the semiconductor package 116 with the test socket. The four lower package guide members 108 are closed to form a space through which the semiconductor package can just pass through. Because the semiconductor package 116 can or will contact the lower guide member(s) 108 as it passes through this space, static electricity could be generated. Preferably, therefore, the lower package guide members 108 are formed of a conductive material, such as steel, to prevent charge from accumulating in the semiconductor device package as it slides along the lower guide member(s) 108.

According to the present invention described above, the loader for use with the semiconductor package burn-in test equipment allows a test socket to be commonly used for semiconductor packages of all sizes. Therefore, the costs associated with testing the semiconductor packages for quality, and maintaining the test equipment, in particular, the test sockets, are kept low.

Furthermore, although the present invention has been described with reference to the preferred embodiments, various modifications thereof will be apparent to those of ordinary skill in the art. For instance, the loader of the present invention is not restricted to that which is used in a burn-in test but has a wide range of uses including all of those related to the final electrical testing of semiconductor packages. Thus, all such modifications are seen to be within the true spirit and scope of the present invention as defined by the appended claims.

What is claimed is:

1. A loader for use in loading a semiconductor package onto a test socket, said loader comprising:
   a main loader body;
   a main nozzle body disposed below the center of said main loader body, said main nozzle body having an internal vacuum line, and said main nozzle body being mounted to said main loader body so as to be movable vertically relative thereto between an upper home position and a lower pick-up/delivery position;
   a vacuum suction head disposed below said main nozzle body and connected to said vacuum line such that a vacuum produced in said line creates suction at an end of the head, the end of said vacuum suction head being configured to pick up a semiconductor package using the suction;
   a socket cover depressing head extending around said main nozzle body and said vacuum suction head, and disposed below said main loader body, the socket cover depressing head configured to depress a socket cover of a test socket; and
   a package guider fixed to said main loader body, said package guider including a plurality of lower package guide members interposed between an inner surface of said socket cover depressing head and respective outer surfaces of said main nozzle body and vacuum suction head, said lower package guide members having respective inner guide surfaces confronting each other adjacent the end of said vacuum suction head so as to define a space therebetween in which the end of said head is accommodated, said guide members being supported in the loader so as to be movable between a closed position and an open position, said guide surfaces being located further away from one another and the vacuum suction head when said guide members are in said open position than when said guide members are in said closed position wherein said space is wider when said guide members are in said open position than when said guide members are in said closed position, and said package guider including a mechanism by which said package guide members are brought to said open position when said main nozzle body is at said pick-up/delivery position, and to said closed position when said main nozzle body is at said upper home position, said guide surfaces of the guide members extending below the end of said vacuum suction head when in said closed position, whereby the guide surfaces of said package guide members guide a semiconductor package dropped by the vacuum suction head once the vacuum suction in the vacuum suction line is turned off while the main nozzle body is in said upper home position.

2. The loader of claim 1, wherein said package guider further comprises an upper package guide member, and connection springs connecting said lower package guide members to said upper package guide member and biasing said lower package guide members, said mechanism comprising cams integral with said lower guide members.

3. The loader for of claim 2, wherein said cams are each constituted by a respective protrusion at an inner surface of a said lower package guide member.

4. The loader of claim 1, wherein said plurality of lower guide members comprises four package guider members disposed symmetrically about said vacuum suction head.

5. The loader of claim 1, wherein the lower package guide members are of an electrically conductive material.

6. The loader for semiconductor package processing of claim 5, wherein the conductive material is steel.

7. Test equipment for use in testing the reliability of semiconductor packages of various sizes, said test equipment comprising:
   a universal test socket including a main socket body, a socket main cover disposed on top of said main socket body, resilient support bars that support said socket cover above said socket main body such that said socket cover can be depressed towards said socket main body, a flat connection plate disposed in said main socket body and having internal electrical connection contacts, and wirings connected to said electrical connection contacts of the flat connection plate, said electrical connection contacts being arrayed in a pattern corresponding to patterns of external connection terminals of semiconductor packages of different sizes; and
   a loader for loading semiconductor packages of various sizes onto the test socket and picking up tested semiconductor packages from the test socket, said loader including a main loader body,
   a main nozzle body disposed below the center of said main loader body, said main nozzle body having an internal vacuum line, and said main nozzle body being mounted to said main loader body so as to be movable vertically relative thereto between an upper home position and a lower pick-up/delivery position,
   a vacuum suction head disposed below said main nozzle body and connected to said vacuum line such that a vacuum produced in said line creates suction at an end of the head, the end of said vacuum suction head being configured to pick up a semiconductor package using the suction;
   a socket cover depressing head extending around said main nozzle body and said vacuum suction head, and disposed below said main loader body, the socket cover depressing head configured to depress said socket cover of the test socket when pressed against the socket cover, and a package guider fixed to said main loader body, said package guider including a plurality of lower package guide members interposed between an inner surface of said socket cover depressing head and respective outer surfaces of said main nozzle body and vacuum suction head, said lower package guide members having respective inner guide surfaces confronting each other adjacent the end of said vacuum suction head so as to define a space therebetween in which the end of said head is accommodated, said guide members being supported in the loader so as to be movable between a closed position and an open position, said guide surfaces being located further away from one another and the vacuum suction head when said guide members are in said open position than when said guide members are in said closed position wherein said space is wider when said guide members are in said open position than when said guide members are in said closed position, and said package guider including a mechanism by which said package guide members are brought to said open position when said main nozzle body is at said pick-up/delivery position, and to said closed position when said main nozzle body is at said upper home position, said guide surfaces of the guide members extending below the end of said vacuum suction head when in said closed position, whereby the guide surfaces of said package guide members guide a semiconductor package dropped by the vacuum suction head once the vacuum suction in the vacuum suction line is turned off while the main nozzle body is in said upper home position.

8. The test equipment of claim 7, wherein said test socket is a burn-in test socket.

9. The loader of claim 7, wherein said package guider further comprises of an upper package guide member, and connection springs connecting said lower package guide members to said upper package guide member and biasing said lower package guide members, said mechanism comprising cams integral with said lower guide members.

10. The loader for of claim 9, wherein said cams are each constituted by a respective protrusion at an inner surface of a said lower package guide member.

11. The loader of claim 7, wherein said plurality of lower guide members comprises four package guider members disposed symmetrically about said vacuum suction head.

12. The loader of claim 7, wherein the lower package guide members are of an electrically conductive material.

13. The loader for semiconductor package processing of claim 12, wherein the conductive material is steel.

14. A method of loading a semiconductor package onto a test socket, said method comprising:

gripping a semiconductor package with a vacuum suction head through the use of vacuum suction;

positioning the gripped semiconductor package over the test socket at a delivery position;

once the gripped semiconductor package is placed at said delivery position, releasing the suction so that the semiconductor package drops onto the test socket; and as the semiconductor package is being placed at the delivery position over the test socket, moving guide surfaces inwardly toward one another into guiding positions at which the guide surfaces are located between the semiconductor package and the test socket and delimit a space through which the semiconductor package must pass when dropped onto the test socket from the delivery position, is said space being aligned with the test socket, whereby any gripped semiconductor package that is at said delivery position and is out of alignment with said test socket, will be guided by said guide surfaces through said space and into alignment with the test socket when the suction is cut off and the mis-aligned semiconductor package is dropped.

15. The method of claim 14, wherein said gripping of the semiconductor package comprises moving the vacuum suction head downward against the top of the package, and then raising the vacuum suction head once the semiconductor package is adhered therethrough the use of vacuum suction, and further comprising moving the guide surfaces outwardly away from one another as the vacuum suction head is lowered onto the package.

16. The method of claim 14, wherein said positioning of the semiconductor package over the test socket and said moving of the guide surfaces comprises setting the guide surfaces, with the semiconductor package in said delivery position, relative to the test socket such that the distance between the bottom of the guide surfaces and a surface of the test socket onto which the semiconductor package is to be dropped is less than the thickness of the gripped semiconductor package.

* * * * *